(12) United States Patent
Oota

(10) Patent No.: US 10,911,699 B2
(45) Date of Patent: Feb. 2, 2021

(54) IMAGING APPARATUS, CONTROL METHOD OF IMAGING APPARATUS, AND PROGRAM

(71) Applicant: CANON KABUSHIKI KAISHA, Tokyo (JP)

(72) Inventor: Makoto Oota, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 72 days.

(21) Appl. No.: 16/049,618

(22) Filed: Jul. 30, 2018

(65) Prior Publication Data

US 2018/0338097 A1 Nov. 22, 2018

Related U.S. Application Data

(63) Continuation of application No. 15/400,851, filed on Jan. 6, 2017, now Pat. No. 10,063,798.

(30) Foreign Application Priority Data

Jan. 14, 2016 (JP) .................. 2016-005346

(51) Int. Cl.
*H04N 5/357* (2011.01)
*G06T 5/00* (2006.01)
(Continued)

(52) U.S. Cl.
CPC .......... *H04N 5/3575* (2013.01); *G06T 5/002* (2013.01); *H04N 5/2173* (2013.01);
(Continued)

(58) Field of Classification Search
None
See application file for complete search history.

(56) References Cited

U.S. PATENT DOCUMENTS

2006/0093235 A1\* 5/2006 Takarada ............... G06T 5/002
382/264
2009/0141149 A1\* 6/2009 Zhang ..................... G06T 5/009
348/241
(Continued)

FOREIGN PATENT DOCUMENTS

JP 2003-156677 A 5/2003
JP 2014-216795 A 11/2014

*Primary Examiner* — Quan Pham
(74) *Attorney, Agent, or Firm* — Canon U.S.A., Inc.

(57) ABSTRACT

An imaging apparatus includes an imaging element, a readout unit, and a signal processing unit. The imaging element includes pixels that have photoelectric conversion units for one micro lens. The readout unit performs a first readout operation on pixels included in a first region of the imaging element to read signals according to accumulated electric charges, and performs a second readout operation on pixels included in a second region different from the first region to read signals according to accumulated electric charges. The signal processing unit makes a correction for reducing noise levels to the signals readout by the readout unit. The signal processing unit makes the correction to the signals acquired from the first region such that differences between noise levels included in the signals read by the first readout operation and the second readout operation become smaller after the correction by the signal processing unit.

18 Claims, 10 Drawing Sheets

(51) Int. Cl.
*H04N 5/217* (2011.01)
*H04N 5/3745* (2011.01)
*H04N 5/378* (2011.01)
*H01L 27/146* (2006.01)

(52) U.S. Cl.
CPC ........... *H04N 5/3572* (2013.01); *H04N 5/378* (2013.01); *H04N 5/37457* (2013.01); *H01L 27/14627* (2013.01)

(56) References Cited

U.S. PATENT DOCUMENTS

| | | | | |
|---|---|---|---|---|
| 2011/0149122 A1* | 6/2011 | Subbotin | ............... | G06T 5/20 |
| | | | | 348/242 |
| 2013/0229555 A1* | 9/2013 | Hashimoto | .......... | H04N 5/3696 |
| | | | | 348/300 |
| 2013/0329004 A1* | 12/2013 | Baqai | ................. | H04N 5/217 |
| | | | | 348/36 |
| 2014/0118587 A1* | 5/2014 | Ikedo | ................ | H04N 5/23212 |
| | | | | 348/281 |
| 2014/0267865 A1* | 9/2014 | Kishi | ................. | G03B 13/36 |
| | | | | 348/310 |
| 2014/0362190 A1* | 12/2014 | Takagi | ................ | H04N 5/3696 |
| | | | | 348/49 |
| 2014/0362279 A1* | 12/2014 | Takeuchi | ............. | H04N 5/3696 |
| | | | | 348/349 |
| 2015/0002838 A1* | 1/2015 | Fukuda | ................ | G02B 7/346 |
| | | | | 356/123 |
| 2015/0341580 A1* | 11/2015 | Yamazaki | .............. | H04N 5/341 |
| | | | | 348/297 |
| 2016/0219237 A1* | 7/2016 | Kobayashi | ............. | H04N 5/363 |
| 2017/0099449 A1* | 4/2017 | Kang | ................ | H04N 5/36961 |

* cited by examiner

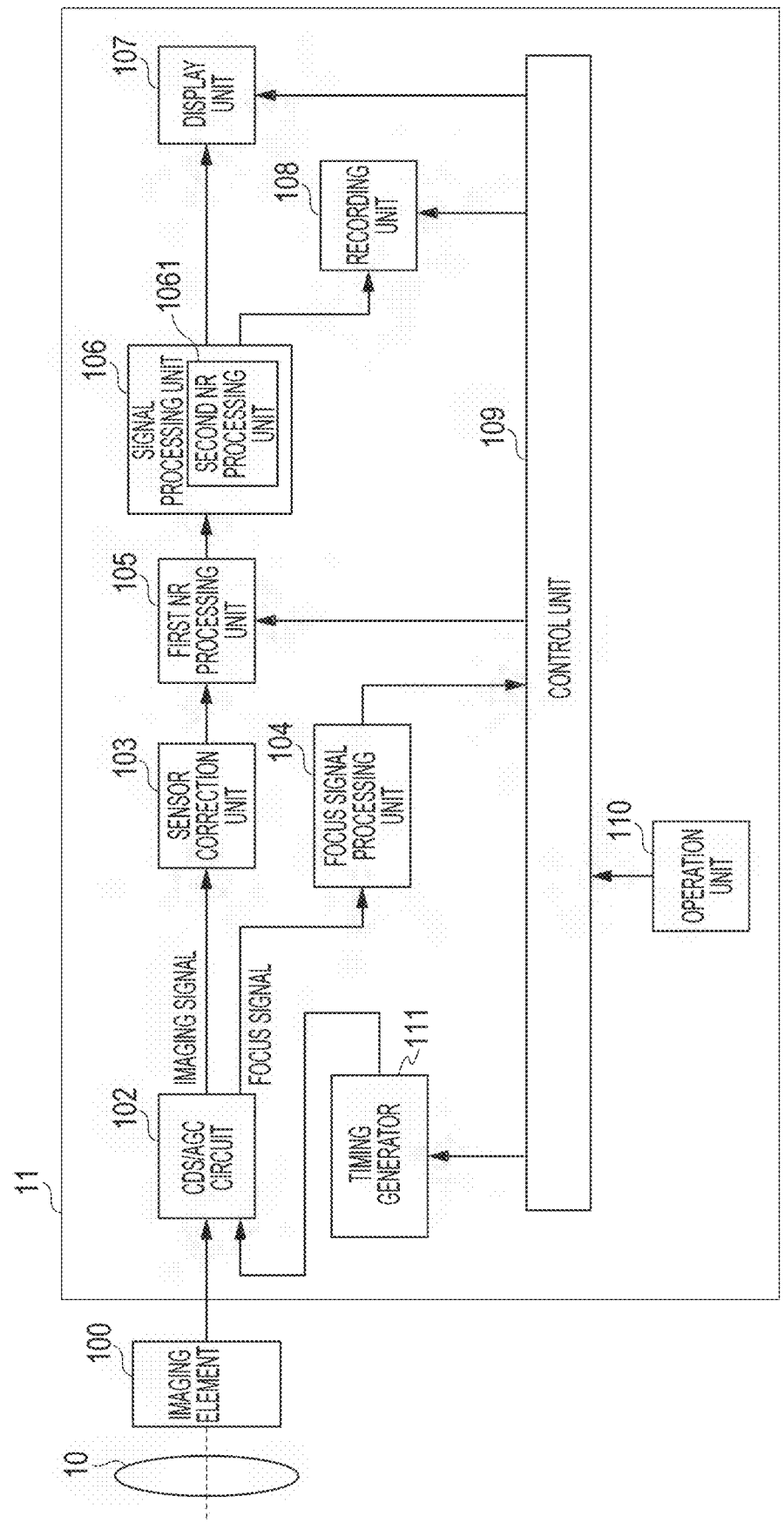

IMAGING APPARATUS, CONTROL METHOD OF IMAGING APPARATUS, AND PROGRAM

CROSS REFERENCE TO RELATED APPLICATIONS

This application is a continuation of U.S. patent application Ser. No. 15/400851, filed on Jan. 6, 2017, which claims priority from Japanese Patent Application No. 2016-005346, filed Jan. 14, 2016, all of which are hereby incorporated by reference herein in their entirety.

BACKGROUND OF THE INVENTION

Field of the Invention

An embodiment relates to a technique for reducing noise in an image signal generated by an imaging apparatus.

Description of the Related Art

Japanese Patent Laid-Open No. 2013-068759 proposes an imaging element in which pixels having two photoelectric conversion units for one micro lens are laid out on the entire surface. To detect a phase difference, it is necessary to perform a readout operation on the pixels with the plurality of photoelectric conversion units in such a manner as to obtain at least two signals with a parallax. To this end, there is a possible method by which to output a signal obtained by one of the photoelectric conversion units and then output a signal obtained by the other photoelectric conversion unit, for example. Alternatively, there is another possible method by which to first output a signal obtained by one photoelectric conversion unit and then add up signals obtained by two photoelectric conversion units to output the signal. However, the readout operation for obtaining two signals requires about two times as long as the time for an addition readout operation by which to read and add up signals from the plurality of photoelectric conversion units for the individual pixels. This takes a lot of time to realize phase difference detection. Accordingly, Japanese Patent Laid-Open No. 2013-068759 discloses that signal readout is performed in such a manner that switching takes place within one frame between the operation of reading two signals from the pixels at predetermined periods and the operation of reading and adding up the signals from the individual pixels. Then, performing focus control with the use of the read two signals makes it possible to performance an image plane phase difference autofocus (AF). Accordingly, focus control can be performed while suppressing increase in time for signal readout due to the image plane phase difference AF.

However, to read signals of one frame by the use of the imaging element disclosed in Japanese Patent Laid-Open No. 2013-068759, when separate readout and addition readout are selectively performed by line, there is an issue that the level of noise varies from line to line.

The reason will be briefly explained. In the case where one pixel includes two photo diodes (PDs) to perform a pupil-dividing function, first, signals obtained by the individual PDs are output and then the signals obtained by the two PDs are added up and output in lines in which signals for focus detection are read, whereas signals obtained by the two PDs are merely added up and output in rows in which signals for image generation are read. Since the signal output is performed twice in the lines in which signals for focus detection are read, it takes longer time between making a reset and completing readout as compared to the rows in which signals for image capture are read and the signals are output only once. This decreases the operating frequency range between the signals and increases flicker noise. Accordingly, when focus detection is conducted only in part of an image and signals for focus detection are read only from the rows in that part, there arises an issue that the noise level varies between the lines in which focus detection is conducted and the rows in which focus detection is not conducted.

In addition, in the case of reading separately the signals obtained by the two PDs, for example, the signal for image capture is obtained by reading the single pixels twice and adding up the signals, readout noise is superimposed twice. This noise issue caused by driving the imaging element as described in Japanese Patent Laid-Open No. 2013-068759 has not been recognized at all.

SUMMARY OF THE INVENTION

For an imaging apparatus including an imaging element having pixels with a plurality of photoelectric conversion units, an embodiment works towards suppressing influence by different noise components resulting from different reading methods.

According to an aspect of the present invention, an imaging apparatus includes an imaging element including a plurality of pixels configured to have a plurality of photoelectric conversion units for one micro lens, a readout unit configured to perform a first readout operation on pixels included in a first region of the imaging element to read signals according to accumulated electric charges, and perform a second readout operation, different from the first readout operation, on pixels included in a second region different from the first region to read signals according to accumulated electric charges, and a signal processing unit configured to make a correction for reducing noise levels to the signals readout by the readout unit, wherein the signal processing unit makes the correction to the signals acquired from the first region such that differences between noise levels included in the signals read by the first readout operation and the second readout operation become smaller after the correction by the signal processing unit.

Further features of the present invention will become apparent from the following description of exemplary embodiments (with reference to the attached drawings).

BRIEF DESCRIPTION OF THE DRAWINGS

FIG. 1 is a block diagram illustrating an example of a schematic configuration of an imaging apparatus.

DESCRIPTION OF THE EMBODIMENTS

Figure 2A:
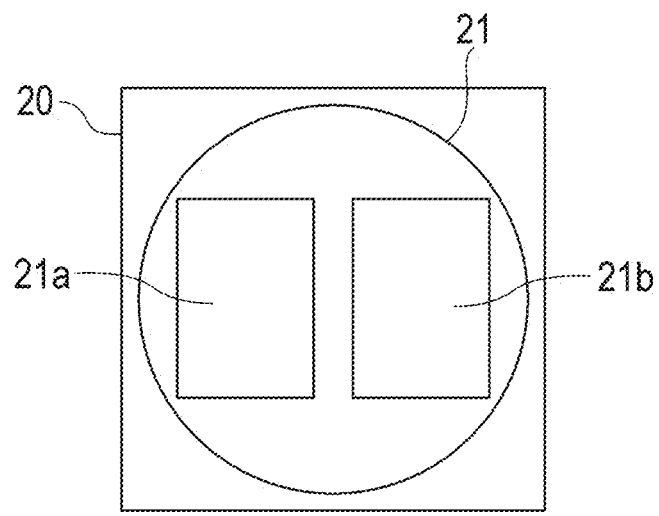
FIG. 2A is a planar view of a pixel having two PDs and FIG. 2B is a planar view of a pixel having four PDs.

Exemplary embodiments will be explained below in detail with reference to the accompanying drawings. However, configurations of the following embodiments are mere examples and not limited to the configurations illustrated in the drawings.

First Embodiment

<Configuration of an Imaging Apparatus>

FIG. 1 is a block diagram illustrating a schematic configuration of an imaging apparatus of the embodiment including an image processing device 11 that processes signals output from an imaging element 100.

In the configuration of FIG. 1, light flux entered via a lens unit 10 forms an image on a light receiving surface of the imaging element 100. An object image formed on the light receiving surface is subjected to photoelectric conversion into electric charges according to the amount of incident light at two PDs 21a and 21b of a pixel 20 of the imaging element 100 illustrated in FIG. 2A, and the electric charges are accumulated there. The electric charges accumulated in the PDs 21a and 21b are sequentially read as voltage signals according to the electric charges from the imaging element 100 based on a driving pulse provided by a timing generator 111 under an instruction from a control unit 109 composed of a CPU. The control unit 109 instructs the timing generator 111 to perform addition readout or division readout from individual rows. The addition readout and the division readout will be described later in detail.

The image signals read by the imaging element 100 are input into a correlated double sampling (CDS)/gain control amplifier (AGC) circuit 102. The CDS/AGC circuit 102 performs correlated double sampling to remove reset noise, gain adjustment, signal digitization. The CDS/AGC circuit 102 outputs the image signals output from the imaging element 100 to a sensor correction unit 103 based on the driving pulse provided by the timing generator 111. The CDS/AGC circuit 102 outputs image signals for focus detection output from the imaging element to a focus signal processing unit 104, and the details will be described later.

The sensor correction unit 103 makes a correction to remove the influence of image quality degradation in relation to the configuration of the imaging element 100. The target of the correction includes the influence of sensitivity failure of the PDs 21a and 21b (defective pixel), for example. The target of the correction also includes the influence of shot noise and dark current on the PDs 21a and 21b and a floating diffusion (FD) region 423 illustrated in FIG. 4, and uneven characteristics of a column amplifier in a readout circuit 303.

A first NR processing unit 105, as a portion of an application-specific integrated circuit (ASIC) in which circuits with a plurality of specific functions is integrated, performs a noise reduction process (NR process) on image signals output from the sensor correction unit 103 to adjust the amounts of noise in the individual lines resulting from the difference between the addition readout operation and the division readout operation. The process by the first NR processing unit 105 will be described later in detail.

A signal processing unit 106, as another portion of the ASIC, subjects the image signals output from the first NR processing unit 105 to various kinds of image processing such as white balance correction, color level adjustment, false color suppression, high-frequency component processing, gamma correction, shading correction, and the like to generate image signals. The signal processing unit 106 also has a second NR processing unit 1061 to perform a process for reducing noise included in the image signals. The process by the second NR processing unit 1061 will be described later in detail. The first NR processing unit 105 and the signal processing unit 106 may not be provided as hardware, as the control unit 109 can perform according to the description in a program, to realize the same effects as the first NR processing unit 105 and the signal processing unit 106.

A display unit 107 is a display device such as an LCD, an organic EL, or the like to display an image based on the image signals output from the signal processing unit 106. In a recording mode to record the image signals, the processed image signals are sent from the signal processing unit 106 to a recording unit 108 and are recorded in a recording medium such as an optical disc, a semiconductor memory, a magnetic tape, or the like.

The focus signal processing unit 104 performs a publicly known correlation calculation with a pair of focus detection signals output from the CDS/AGC circuit 102 to determine defocus amount, and outputs the determined defocus amount to the control unit 109. The control unit 109 performs a focus control to drive a focus lens included in the lens unit 10 to a focus position based on the obtained defocus amount.

The control unit 109 performs a control to determine whether to perform addition readout or division readout from the individual rows as described above, and exchanges information with the components of the image processing device 11 to control the components. Further, the control unit 109 powers on or off the apparatus, changes settings, makes records, and switches between auto focus (AF) control and manual focus (MF) control according to the input from an operation unit 110 operated by the user. The control unit 109 also performs various functions according to the user operation such as verification of recorded images and selection of a focus detection region.

<Schematic Configuration of the Imaging Element>

FIG. 2A is a planar view of a pixel 20 constituting a pixel section 301. As illustrated in FIG. 2A, the pixel 20 corresponds to one micro lens 21 and has two photoelectric conversion units composed of PDs 21a and 21b.

Figure 2B:
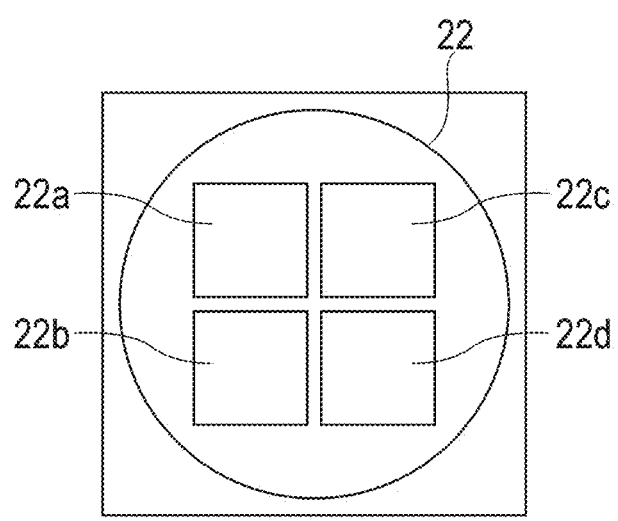

FIG. 2B illustrates a structure of four photoelectric conversion units corresponding to one micro lens 22 and composed of PDs 22a, 22b, 22c, and 22d. The following description is based on the structure in which the two PDs correspond to the one micro lens illustrated in FIG. 2A. However, the following description is also applicable to the structure in which three or more PDs correspond to one micro lens as illustrated in FIG. 2B.

Figure 3:
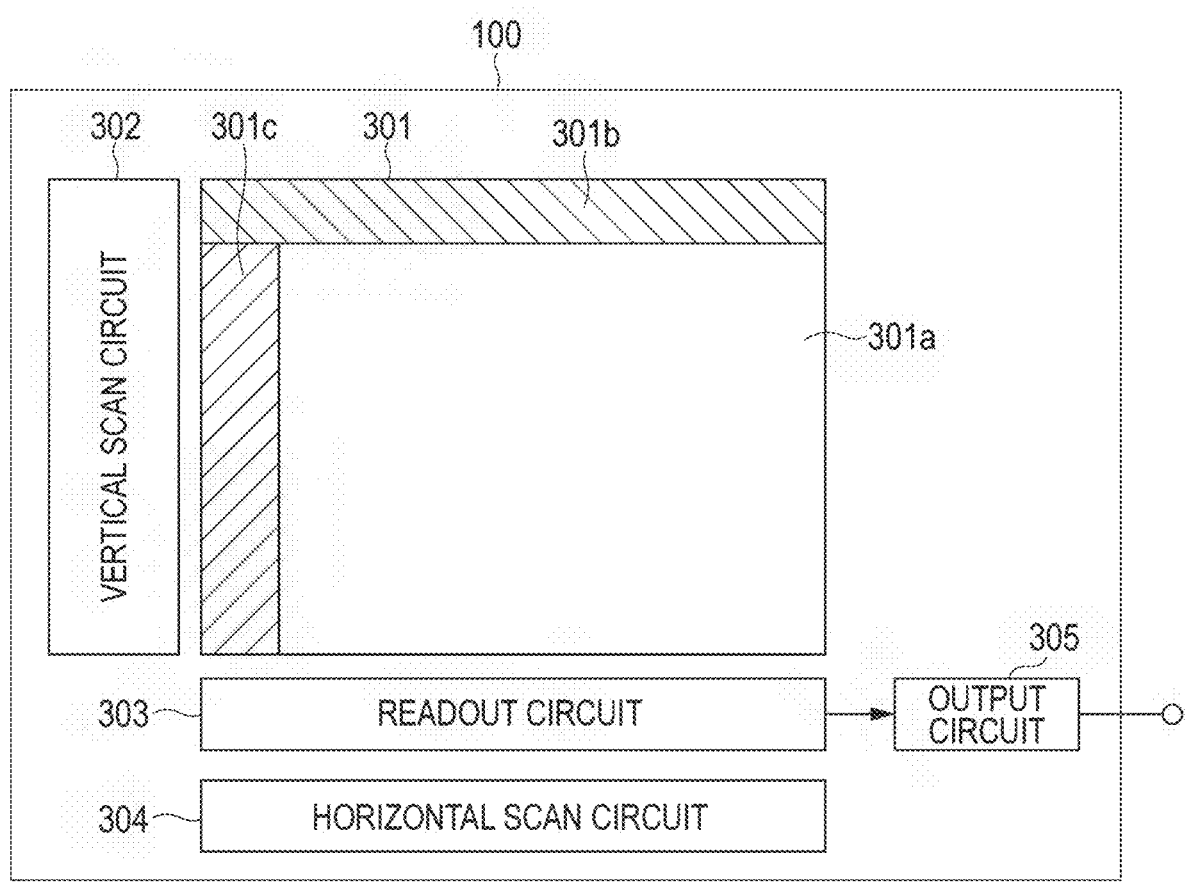
FIG. 3 is a diagram illustrating a schematic configuration of an imaging element according to an embodiment.

FIG. 3 is a diagram illustrating a schematic configuration of the imaging element 100 according to the embodiment. As illustrated in FIG. 3, the imaging element 100 has a pixel section 301 in which a plurality of pixels is arranged two-dimensionally, a vertical scan circuit 302, a readout circuit 303, a horizontal scan circuit 304, and an output circuit 305. The pixel section 301 includes an effective region 301a in which incident light is received and subjected to photoelectric conversion, an optically light-shielded vertical optical black (OB) region 301b, and an optically light-shielded horizontal optical black (OB) region 301c.

The vertical scan circuit 302 selects and controls an arbitrary pixel line from the pixel section 301. The readout circuit 303 reads the signals output from the pixels in the line selected by the vertical scan circuit 302, and transfers the read signals to the output circuit 305 under control of the horizontal scan circuit 304. The output circuit 305 sends the signals to the outside of the imaging element 100.

Figure 4:
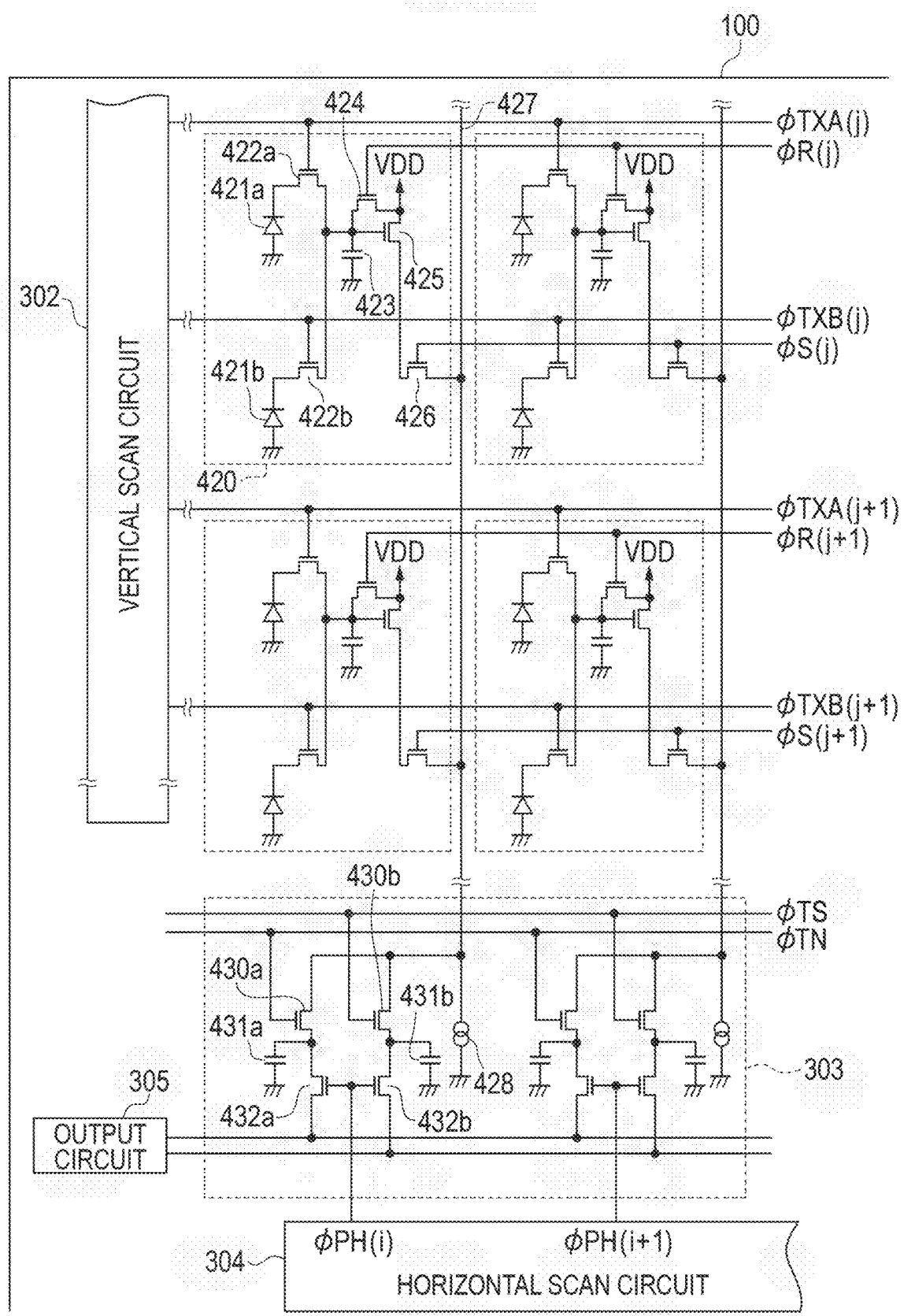
FIG. 4 is a diagram illustrating an internal circuit configuration of a pixel according to the embodiment.

FIG. 4 is an equivalent circuit diagram illustrating a configuration of, out of the plurality of pixels provided in the pixel section 301, the pixels in two adjacent rows (j-th row and (j+1)-th row) and two adjacent columns (i-th column and (i+1)-th column) and the readout circuit 303 for the two columns (i-th column and (i+1)-th column).

A control signal ΦTXA(j) is input into the gate of a transfer switch 422a of pixels 420 in the j-th row, and a control signal ΦTXB(j) is input into the gate of a transfer switch 422b of the same. A reset switch 424 is controlled by a reset signal ΦR(j). The control signals ΦTXA(j) and TXB(j), the reset signal ΦR(j), and a row selection signal ΦS(j) are controlled by the vertical scan circuit 302. Similarly, pixels in the (j+1)-th row is controlled by control signals ΦTXA(j+1) and ΦTXB(j+1), a reset signal ΦR(j+1), and a row selection signal ΦS(j+1).

A vertical signal line 427 is provided for each pixel column and is connected to a power source 428 and transfer switches 430a and 430b of the readout circuit 303 provided in each column.

A control signal ΦTN is input into the gate of the transfer switch 430a, and a control signal ΦTS is input into the gate of the transfer switch 430b. In addition, a control signal ΦPH output from the horizontal scan circuit 304 is input into the gates of transfer switches 432a and 432b. An accumulation capacitor unit 431a accumulates the output from the vertical signal line 427 when the transfer switch 430a is on and the transfer switch 432a is off. Similarly, an accumulation capacitor unit 431b accumulates the output from the vertical signal line 427 when the transfer switch 430b is on and the transfer switch 432b is off.

By turning on the transfer switches 432a and 432b in the i-th column by a column selection signal ΦPH(i) from the horizontal scan circuit 304, the outputs of the accumulation capacitor units 431a and 431b are transferred to the output circuit 305 via different horizontal output lines.

As readout operations for reading signals from the imaging element 100 configured as described above, an addition readout operation (first readout operation) and a division readout operation (second readout operation) can be selectively performed. The addition readout operation and the division readout operation will be explained below with reference to FIGS. 5 and 6. In the embodiment, the switches are turned on when the control signals are in H (high) state and are turned off when the control signals are in L (low) state.

<Addition Readout Operation> (First Readout Operation)

Figure 5:
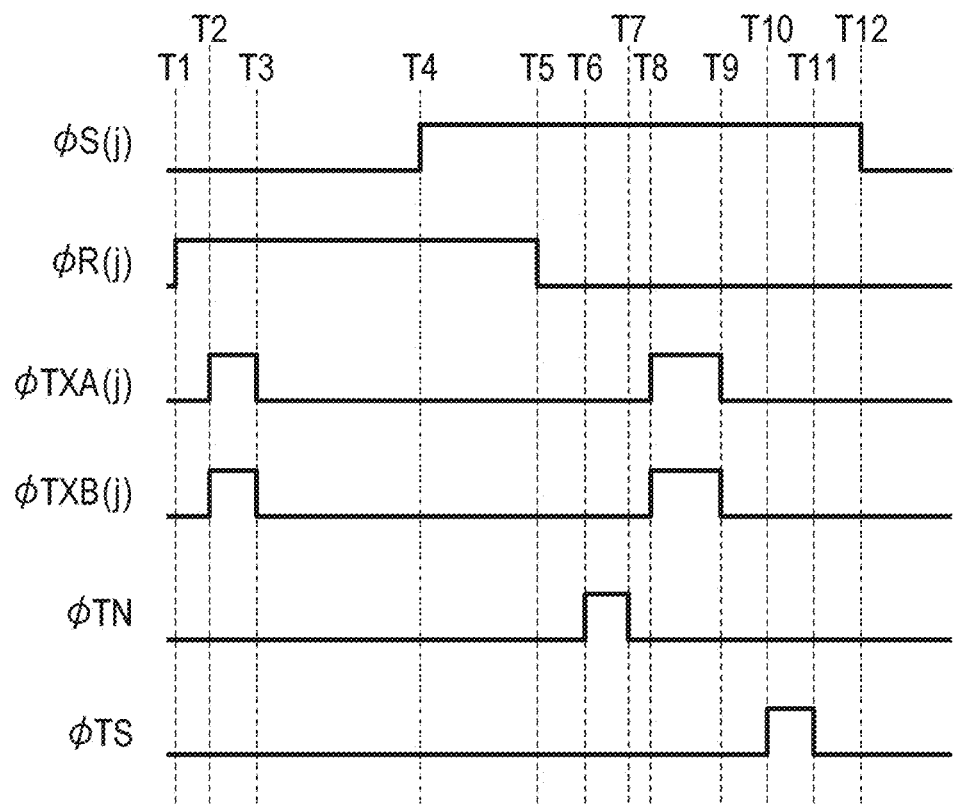
FIG. 5 is a diagram illustrating timings for an addition readout operation by the imaging element according to the embodiment.

FIG. 5 illustrates timings for reading signals from the pixel in the j-th row of the imaging element 100 by the addition readout operation. At time T1, the reset signal ΦR(j) becomes H. Then, when the control signals ΦTXA(j) and ΦTXB(j) become H at time T2, the PDs 421a and 421b of the pixel 420 in the j-th row are reset. PDs 421a and 421b illustrated in FIG. 4 correspond to the PDs 21a and 21b illustrated in FIG. 2, respectively.

When the control signals ΦTXA(j) and ΦTXB(j) become L at time T3, the PDs 421a and 421b start charge accumulation. Subsequently, when the row selection signal ΦS(j) becomes H at time T4, a row selection switch 426 is turned on and connected to the vertical signal line 427, and a source follower amplifier 425 enters operational state.

When the reset signal ΦR(j) becomes L at time T5 and then the control signal ΦTN becomes H at time T6, the transfer switch 430a is turned on to transfer a signal after reset cancel on the vertical signal line 427 (noise signal) to the accumulation capacitor unit 431a.

Then, the control signal ΦTN becomes L at time T7 and the noise signal is held in the accumulation capacitor unit 431a. After that, when the control signals ΦTXA(j) and ΦTXB(j) become H at time T8, the electric charges in the PDs 421a and 421b are transferred to an FD region 423. Since the electric charges in the two PDs 421a and 421b are transferred to the same FD region 423, the signals to which the electric charges in the two PDs 421a and 421b are added (optical signal of one pixel+noise signal) are output to the vertical signal line 427.

When the control signals ΦTXA(j) and ΦTXB(j) become L at time T9. After that, when the control signal ΦTS becomes H at time T10, the transfer switch 430b is turned on to transfer the signals on the vertical signal line 427 (optical signal of one pixel+noise signal) to the accumulation capacitor unit 431b.

The control signal ΦTS becomes L at time T11. The optical signal of one pixel+noise signal are held in the accumulation capacitor unit 431b, and then the row selection signal ΦS(j) becomes L at time T12.

After that, the column selection signals ΦPH from the horizontal scan circuit 304 become H to sequentially turn on the transfer switches 432a and 432b in sequence from the first pixel column to the last pixel column. Accordingly, the noise signal from the accumulation capacitor unit 431a and the optical signal of one pixel+noise signal from the accumulation capacitor unit 431b are transferred to the output circuit 305 via different horizontal output lines. The output circuit 305 calculates the difference between the two horizontal output lines (optical signal of one pixel) and outputs the signal in which the difference is multiplied by a predetermined gain value. The signal obtained by the addition readout described above will be hereinafter called "first additional signal."

<Division Readout Operation> (Second Readout Operation)

Figure 6:
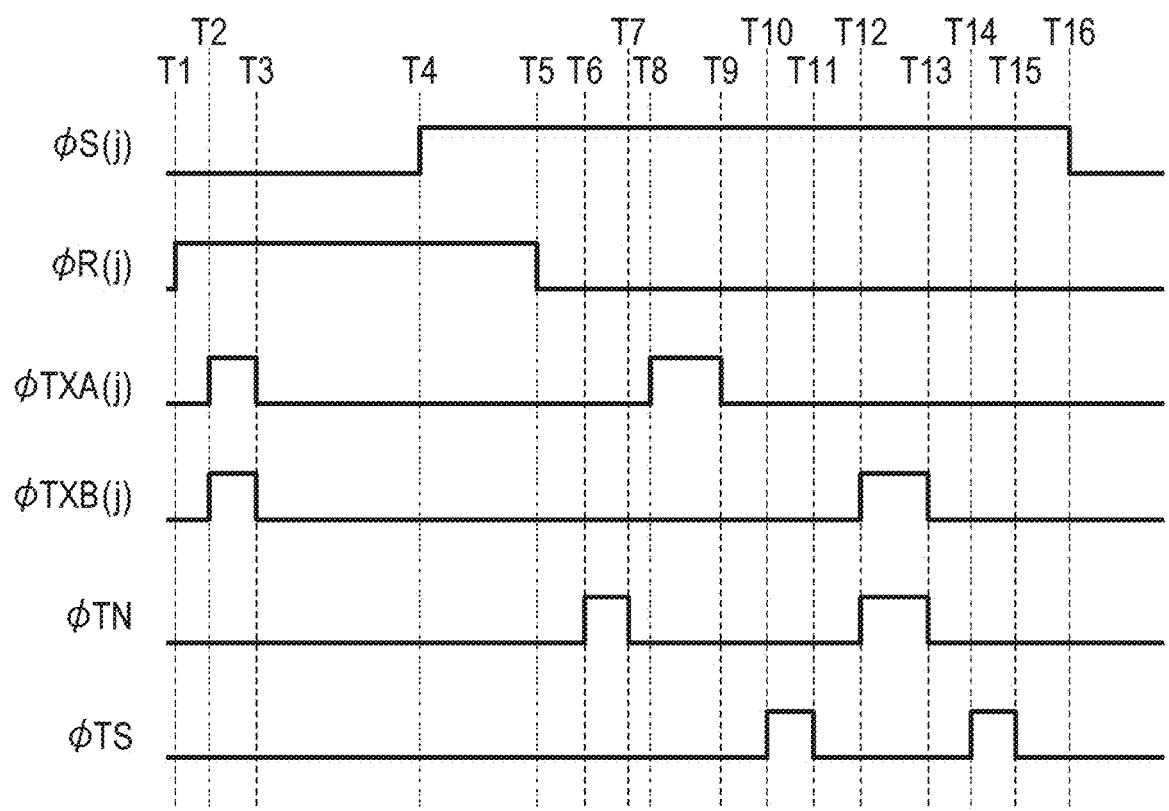
FIG. 6 is a diagram illustrating timings for a division readout operation by the imaging element according to the embodiment.

Next, the division readout operation will be explained with reference to FIG. 6. FIG. 6 illustrates timings for reading signals from the pixel in the j-th row of the imaging element 100 by the division readout operation. At time T1, the reset signal ΦR(j) becomes H. Subsequently, when the signals ΦTXA(j) and ΦTXB(j) become H at time T2, the PDs 421a and 421b of the pixel 20 in the j-th row are reset. Next, when the control signals ΦTXA(j) and ΦTXB(j) become L at time T3, the PDs 421a and 421b start charge accumulation. Subsequently, when the row selection signal ΦS(j) becomes H at time T4, the row selection switch 426 is turned on and connected to the vertical signal line 427, and the source follower amplifier 425 enters operational state.

After the reset signal ΦR(j) becomes L at time T5, when the control signal ΦTN becomes H at time T6, the transfer switch 430a is turned on to transfer the signal after reset cancel on the vertical signal line 427 (noise signal) to the accumulation capacitor unit 431a.

Next, the control signal ΦTN becomes L and the noise signal is held in the accumulation capacitor unit 431a at time T7. After that, when the signal ΦTXA(j) becomes H at time T8, the electric charges in the PD 421a are transferred to the FD region 423. Since the electric charges in one of the two PDs 421*a* and 421*b* (the electric charges of the PD 421*a* in this example) are transferred, only the signal corresponding to the electric charges in the PD 421*a* is output to the vertical signal line 427.

When the control signal ΦTXA(j) becomes L at time T9 and then the control signal ΦTS becomes H at time T10, the transfer switch 430*b* is turned on to transfer the signals on the vertical signal line 427 (optical signal of one PD+noise signal) to the accumulation capacitor unit 431*b*. Next, the control signal ΦTS becomes L at time T11.

After that, the column selection signals ΦPH from the horizontal scan circuit 304 become sequentially H to turn on the transfer switches 432*a* and 432*b* in sequence from the first pixel column to the last pixel column. Accordingly, the noise signal from the accumulation capacitor unit 431*a* and the optical signal of one PD+noise signal from the accumulation capacitor unit 431*b* are transferred to the output circuit 305 via different horizontal output lines. The output circuit 305 calculates the difference between the two horizontal output lines (optical signal of one PD) and outputs the signal in which the difference is multiplied by a predetermined gain value. The signal obtained by the readout described above will be hereinafter called "divisional signal."

After that, the signals ΦTXA(j) and ΦTXB(j) become H at time T12, and the electric charges in the PD 421*b* are transferred to the FD region 423 in addition to the electric charges in the PD 421*a*. Since the electric charges in the two PDs 421*a* and 421*b* are transferred to the same FD region 423, the signals to which the electric charges in the two PDs 421*a* and 421*b* are added (optical signal of one pixel+noise signal) are output to the vertical signal line 427.

Subsequently, when the control signals ΦTXA(j) and ΦTXB(j) become L at time T13 and then the control signal ΦTS becomes H at time T14, the transfer switch 430*b* is turned on to transfer the signals on the vertical signal line 427 (optical signal of one pixel+noise signal) to the accumulation capacitor unit 431*b*.

Next, the control signal ΦTS becomes L at time T15 and the optical signal for one pixel+noise signal are held in the accumulation capacitor unit 431*b*. Then, the row selection signal ΦS(j) becomes L at time T16.

After that, the transfer switches 432*a* and 432*b* become H in sequence from the first pixel column to the last pixel column by the column selection signal ΦPH of the horizontal scan circuit 304. Accordingly, the noise signal in the accumulation capacitor unit 431*a* and the optical signal of one pixel+noise signal in the accumulation capacitor unit 431*b* are transferred to the output circuit 305 via different horizontal lines. The output circuit 305 calculates the difference between the two horizontal output lines (optical signal of one pixel) and outputs the signal to which the difference is multiplied by a predetermined gain value. The signal obtained by the readout described above will be hereinafter called "second additional signal" to differentiate from the first additional signal.

The divisional signal corresponding to the PD 421*a* is subtracted from the second additional signal read as described above to obtain a divisional signal corresponding to the other PD 421*b*. The pair of divisional signals obtained as described above will be called "focus detection signals" because it is to be used for focus detection in the embodiment. Then, the focus detection signals are sent to the focus signal processing unit 104. The focus signal processing unit 104 performs a publicly known correlation calculation on the focus detection signals to determine the phase difference between the signals. Such a pair of divisional signals can also be used to measure the object distance and the like as well as focus detection.

Alternatively, the series of operations including reset, charge accumulation, and signal readout may be performed on the PD 421*a*, and then the same operations may be performed on the PD 421*b* to read independently the signals from the two PDs 421*a* and 421*b* by one charge accumulation operation. The signals read from the PDs 421*a* and 421*b* by two times can be added up to obtain the second additional signal.

In the foregoing example, two photoelectric conversion units are provided. However, embodiments are not limited to this example but a plurality of photoelectric conversion units capable of outputting signals with parallax may be provided. For example, FIG. 2B illustrates a layout of four PDs in one pixel. The pupil-division PDs 22*a*, 22*b*, 22*c*, and 22*d* correspond to the micro lens 22. Images different in phase can be entered into the PDs 22*a*, 22*b*, 22*c*, and 22*d*, and signals can be read separately from the PDs 22*a*, 22*b*, 22*c*, and 22*d*. Alternatively, signals may be additionally read from the PDs 22*a*, 22*b*, 22*c*, and 22*d*, then signals may be additionally read from the PDs 22*a* and 22*b*, and finally signals may be read from the PDs 22*c* and 22*d*. Accordingly, the phase differences in the horizontal direction can be calculated. Still alternatively, signals may be additionally read from the PDs 22*a*, 22*b*, 22*c*, and 22*d*, then signals may be additionally read from the PDs 22*a* and 22*c*, and finally signals may be read from the PDs 22*b* and 22*d*. Accordingly, the phase differences in the vertical direction can be calculated. The signals obtained from the PDs can be used for phase difference detection and the like.

Increasing the number of PDs can obtain signals for phase difference detection and the like by using a method similar to the foregoing one. Briefly describing, signals from n1 PDs are first additionally read, and signals from n2 PDs out of the n1 PDs are additionally read. In this case, n1>n2 is satisfied. This makes it possible to calculate signals from the remaining PDs and use these signals for phase difference detection and the like.

As described above, in the division readout operation, when the divisional signal is read and then the second additional signal is read, the signal output operation is performed twice. This takes longer time between the start of the reset operation and the completion of the readout as compared to the case of performing the addition readout operation with only one signal output operation. Accordingly, the operating frequency range between the signals decreases and flicker noise increases.

In addition, in the case of reading separately signals from the two PDs, the signal for image generation is obtained by reading the single pixels twice and adding up the signals. That is, the readout noise is superimposed twice on the signal.

<Control at the Time of Frame Reading>

Figure 7:
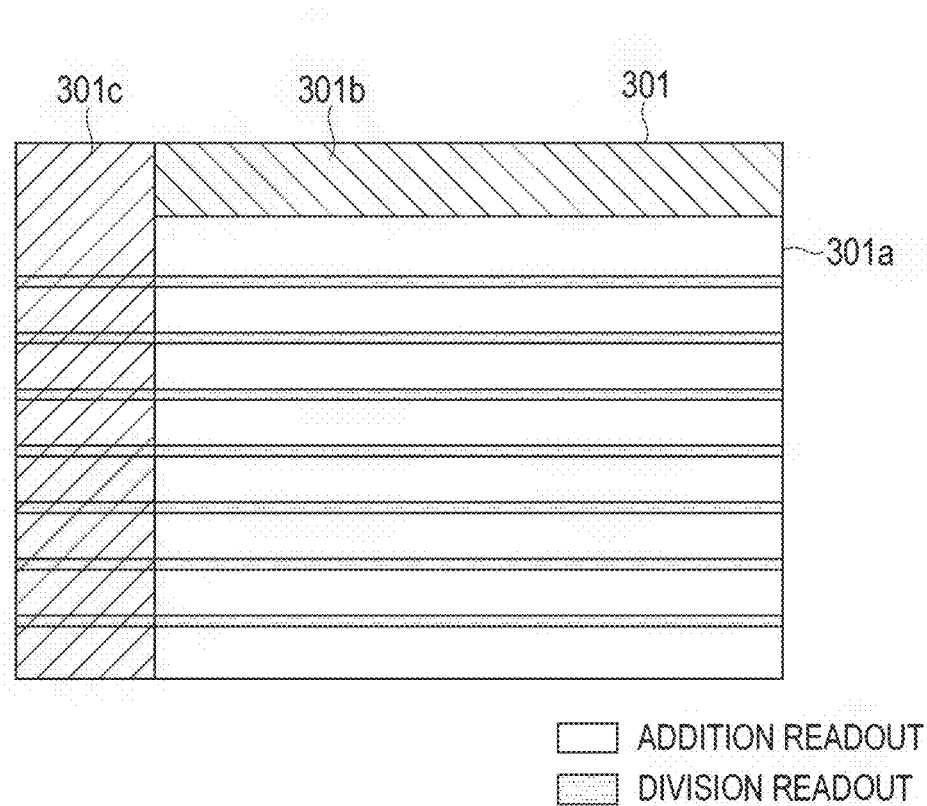
FIG. 7 is a diagram illustrating an example of a selective drive control at the time of readout of one frame according to the embodiment.

In the embodiment, a selective drive control is performed as one of readout controls to read signals of one frame from the imaging element 100. Under the selective drive control, at the time of reading one frame, division readout is performed on pre-decided lines to acquire the focus detection signals and the second additional signal, and addition readout is performed on the other lines to acquire the first additional signal. FIG. 7 is a conceptual diagram illustrating the case in which division readout is performed on every pre-decided line as an example. By selectively performing division readout and addition readout by row within a frame, it is possible to perform focus detection in the phase difference system in arbitrary positions within the frame (selective phase difference AF). It is also possible to shorten the time taken for signal readout and suppress power consumption as compared to the case in which division readout is performed on the entire screen. It is further possible to obtain an image of one frame from the first additional signal and the second additional signal.

FIG. 7 illustrates an example of performing division readout on every pre-decided row, but embodiments are not limited to this. For example, a target region of the focus control may be set from an image signal by the use of an image analysis function such as face detection or based on an instruction from the user, and rows to be superimposed on the target region of the focus control may be set as whole lines in which the division readout operation is to be performed. Alternatively, only a position to be superimposed on the target region of the focus control may be set as a region in which the division readout operation is to be performed.

As described above, the first additional signal and the second additional signal are digitized by the CDS/AGC circuit 102 and then sent to the sensor correction unit 103 where the signals are corrected in sensitivity failure, shot noise, dark current, variations in characteristics of the column amplifier. The CDS/AGC circuit 102 does not eliminate the difference in noise level resulting from the difference between the signal readout operations. Then, the image signals corrected by the sensor correction unit 103 are input into the first NR processing unit 105.

<The Process by the First NR Processing Unit 105>

The first NR processing unit 105 receives from the control unit 109 a signal to differentiate between the addition readout and the division readout, and performs a filtering process on the image signals output from the sensor correction unit 103 according to the received signal. By performing this filtering process, the first NR processing unit 105 makes signal level correction to suppress the influence of the difference in noise components resulting from the difference between the addition readout and the division readout.

Figure 8:
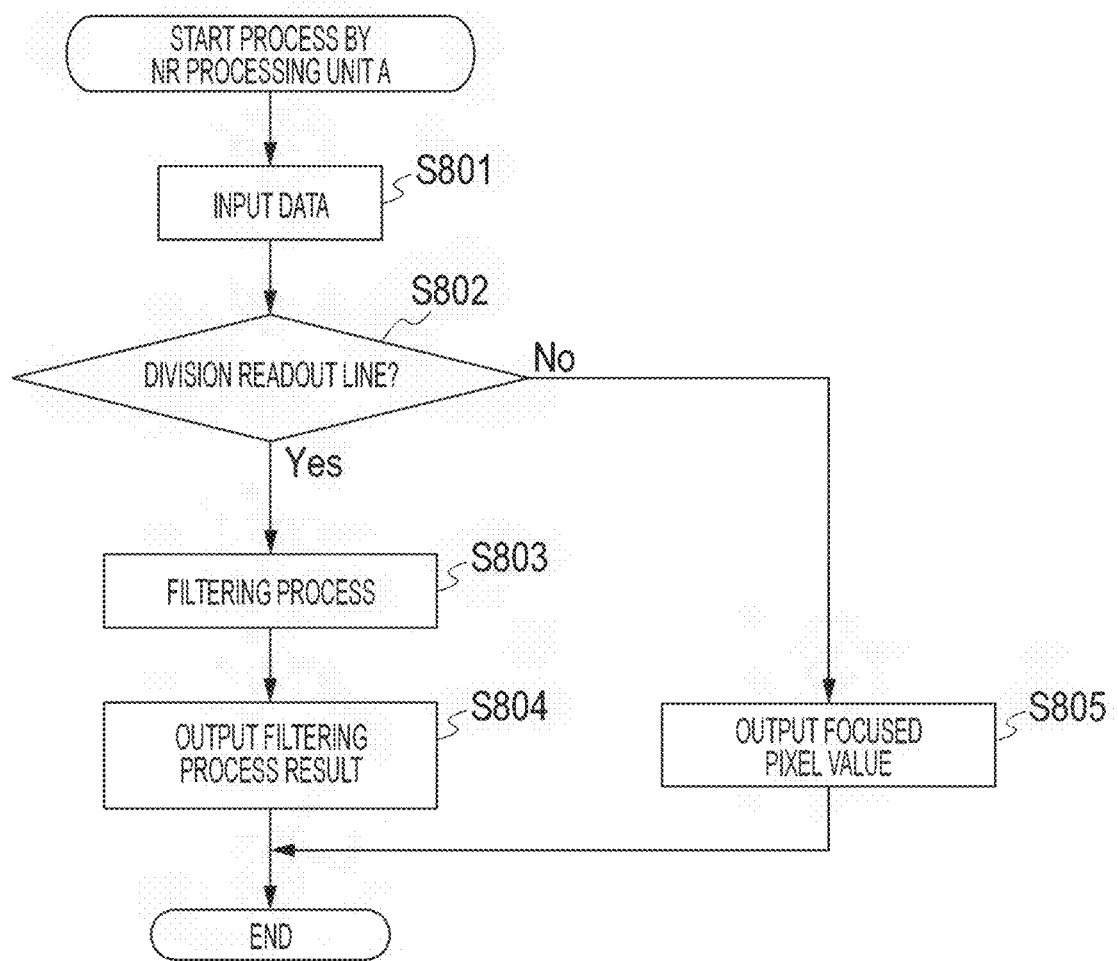
FIG. 8 is a flowchart of a process by a first NR processing unit according to the embodiment.

FIG. 8 describes a flowchart of the process by the first NR processing unit 105.

At step S801, the first NR processing unit 105 acquires image signals of a focused pixel and reference pixels for filtering necessary in the filtering process from the output of the sensor correction unit 103, and moves to step S802. The reference pixels are neighboring pixels included in the range of N×N (N denotes an integer) pixels, where the focused pixel is the center of the range.

At step S802, the first NR processing unit 105 determines whether the focused pixel was subjected to the addition readout or the division readout according to the signal output from the control unit 109, and switches processes depending on the judgment. When the focused pixel was subjected to the division readout, the first NR processing unit 105 moves to step S803, or when the focused pixel was subjected to the addition readout, the first NR processing unit 105 moves to step S805.

Of the signals included in the image signals output from the sensor correction unit 103, the signals of the pixels obtained by the division readout have more noise components than those of the signals of the pixels obtained by the addition readout. Therefore, at step S803, the first NR processing unit 105 performs the filtering process only on the pixels subjected to the division readout to lower the noise levels included in the signals of the pixels obtained by the division readout to be equivalent to those of the signals of the pixels obtained by the addition readout. Then, the first NR processing unit 105 moves to step S804.

At step S804, the first NR processing unit 105 outputs the signal of the focused pixel having undergone the filtering process at step S803, and terminates the process.

At step S805, since the focused pixel is a pixel that was subjected to the addition readout, the first NR processing unit 105 does not perform the filtering process on the focused pixel. Accordingly, the first NR processing unit 105 outputs the signal of the focused pixel received from the sensor correction unit 103 at the original signal level, and terminates the process.

Figure 9:
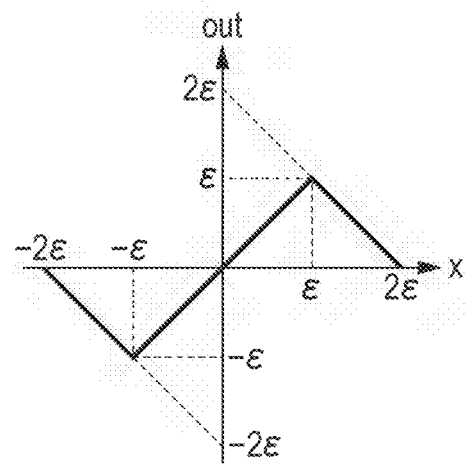
FIGS. 9A to 9G are diagrams illustrating a filtering process by the first NR processing unit according to the embodiment.

Next, the filtering process by the first NR processing unit 105 will be explained with reference to FIG. 9.

FIG. 9A illustrates part of an input image in which the rows indicated with signs y1, y2, y4, and y5 are the lines having undergone the addition readout, and the row indicated with sign y3 is the line having undergone the division readout. The numbers in the pixel positions represent the signal levels of the pixels.

FIG. 9B illustrates pixels in the center of d22 referred to in the filtering process. In FIG. 9B, total nine pixels in the region of three horizontal pixels by three vertical pixels are referred to in the filtering process. In the filtering process, average value processing is carried out such that the focused pixel is compared in signal level to the surrounding reference pixels, and only the signal levels with the absolute values of differences from the focused pixel equal to or lower than a pre-decided threshold TH are used. The comparison may be disabled by setting the threshold TH to an infinite value. The filtering process can be expressed by the equation as follows:

[Equation 1]

$$\text{sum} = \sum_{x=1, y=1}^{x=3, y=3} \text{SUM}(\text{value}(dxy), \text{value}(d22)) \quad \text{(Equation 1)}$$

$$\text{count} = \sum_{x=1, y=1}^{x=3, y=3} \text{COUNT}(\text{value}(dxy), \text{value}(d22))$$

$$\text{output} = \text{sum/count}$$

In (Equation 1), value(dxy) represents the signal level of a pixel dxy positioned in an x-th column and a y-th row, and value(d22) represents the signal level of the pixel d22 as the focused pixel positioned in the second column and the second row. In addition, SUM function and COUNT function in (Equation 1) are as follows:

[Equation 2]

$$\text{SUM}(\text{ref}, \text{center}) = \begin{cases} \text{ref} & (|\text{ref} - \text{center}| < TH) \\ 0 & (|\text{ref} - \text{center}| \geq TH) \end{cases} \quad \text{(Equation 2)}$$

$$\text{COUNT}(\text{ref}, \text{center}) = \begin{cases} 1 & (|\text{ref} - \text{center}| < TH) \\ 0 & (|\text{ref} - \text{center}| \geq TH) \end{cases}$$

In (Equation 2), ref represents the signal level of the reference pixel, and center represents the signal level of the focused pixel. The absolute value of difference in signal level between the reference pixel and the focused pixel is compared to the threshold to decide the outputs of the SUM function and the COUNT function.

FIG. 9C illustrates the result of the filtering process by the (Equation 1) on the input data illustrated in FIG. 9A with the threshold TH of the filtering process set to 20. Since the line y3 is the line having undergone the division readout, the first NR processing unit 105 performs the filtering on the signals of the pixels (x1,y3) to (x5,y3) to reduce the noise levels of the line having undergone the division readout. Since the lines indicated with signs y1, y2, y4, and y5 are the rows having undergone the addition readout, the first NR processing unit 105 does not perform the filtering process but outputs the input signals as they are.

The foregoing filtering process is an example. Besides the foregoing process, the noise levels can be reduced by the use of a processing unit such as an ε filter.

An example of ε filter for the reference region of three horizontal pixels by three vertical pixels will be explained below. The number of pixels may be changed as necessary.

When the pixels to be referred to by the ε filter are set as the ones illustrated in FIG. 9B and filter coefficients of the filtering as the ones illustrated in FIG. 9D, the ε filter can be expressed by the following equation:

[Equation 3]

$$\text{output} = \text{value}(d22) + \frac{1}{\sum_{x=1,y=1}^{x=3,y=3} a_{xy}} * \sum_{x=1,y=1}^{x=3,y=3} a_{xy} * eps(\text{value}(dxy) - \text{value}(d22)) \quad \text{(Equation 3)}$$

$$eps(x) = \begin{cases} 0 & (2\varepsilon < x) \\ -x + 2\varepsilon & (\varepsilon < x \leq 2\varepsilon) \\ x & (-\varepsilon < x \leq \varepsilon) \\ -x - 2\varepsilon & (-2\varepsilon < x \leq -\varepsilon) \\ 0 & (-2\varepsilon \leq x) \end{cases}$$

In (Equation 3), value(dxy) represents the signal level of a pixel dxy positioned in an x-th column and a y-th row as in the (Equation 1). FIG. 9E illustrates a graph of function eps(x). In the ε filter, the difference value between the focused pixel and the reference pixel is varied by processing with the ε function eps(x). When the difference is equal to or more than a specific value, the contribution ratio of the pixel to the filtering is decreased. In Equation 3, when the difference is equal to or more than a specific value, the value by which the filter coefficient axy is multiplied is decreased. The εfunction is an example and the tilt of the straight line to dampen the difference value may be changed.

FIG. 9F describes the filter coefficients of filtering, and FIG. 9G describes the results of filtering by the ε filter in which the value of ε is 15.

Also in the case of using the ε filter, the line y3 is the line having undergone the division readout. Accordingly, the first NR processing unit 105 performs the filtering process on the signals of the pixels (x1,y3) to (x5,y3) to reduce the noise levels of the lines having undergone the division readout. Since the lines indicated with signs y1, y2, y4, and y5 are the lines having undergone the addition readout, the first NR processing unit 105 does not perform the filtering process but outputs the input signals as they are.

As described above, the first NR processing unit 105 performs the filtering process only on the lines having undergone the division readout with more noises than those of the lines having undergone the addition readout. At that time, it is necessary to adjust the noise levels after the reduction to be close to the noise levels of the rows having undergone the addition readout. Accordingly, the first NR processing unit 105 performs the filtering process after adjusting the number of pixels to be referred to in filtering and the threshold of filtering. In this case, either or both of the following adjustments are performed: the one that the number of pixels to be referred to in filtering is more increased as the noise levels of the rows having undergone the addition readout are higher; and the one that the threshold of filtering is more increased as the noise levels of the rows having undergone the addition readout are higher. Thus, the noise levels after the reduction are adjusted.

Further, in the case of using the ε filter, the degree of noise reduction can be adjusted by adjusting the filter coefficients to change the filter characteristics.

In addition, since the first NR processing unit 105 performs the filtering process only on the rows having undergone the division readout, the signal processing unit 106 positioned at the stage subsequent to the first NR processing unit 105 does not need to take into account the differences in the noise level due to the difference in the reading methods. That is, the signal processing unit 106 can use continuously the method of noise reduction process that was used before the introduction of the technique of entirely applying pupil division and selectively using the addition readout and the division readout. Accordingly, the provision of the first NR processing unit 105 eliminates advantageously the need for making changes to the specifications of the circuit arranged at the stage subsequent to the first NR processing unit 105.

The foregoing description has been given as to an example of filtering and the present embodiment should not be limited to the foregoing description of filtering. The first NR processing unit is intended to bring the noise levels of the lines having undergone the addition readout and the noise levels of the rows having undergone the division readout closer to each other, and the first NR processing unit can be modified in various manners as far as the foregoing intention is accomplished. For example, the first NR processing unit may perform filtering not only on the lines having undergone the division readout but also on the lines having undergone the addition readout. However, the degree of noise reduction of filtering on the lines having undergone the division readout is made higher than that on the rows having undergone the addition readout. Accordingly, after the filtering, the noise levels of the rows having undergone the addition readout and the noise levels of the rows having undergone the division readout become closer to each other.

<Process by the Second NR Processing Unit 1061>

The second NR processing unit 1061 performs a noise reduction process by filtering or the like on all the image signals output from the first NR processing unit 105, regardless of whether the pixels having undergone the addition readout or the pixels having undergone the division readout.

The method of the filtering process by the second NR processing unit 1061 may be the same as that of the filtering process by the first NR processing unit 105. Therefore, detailed description thereof will be omitted.

However, as described above, the first NR processing unit 105 performs the filtering process on the lines in which the division readout is performed, whereas the second NR processing unit 1061 performs the process on the lines in which the addition readout is performed and the rows in which the noise level is reduced to be equivalent to the noise level of the rows in which the addition readout is performed. Accordingly, the second NR processing unit 1061 performs the process on the pixels lower in noise level than the pixels on which the first NR processing unit 105 performs the process. Therefore, the threshold set by the second NR processing unit 1061 is preferably smaller than the threshold set by the first NR processing unit 105.

Second Embodiment

In a second embodiment, the process by the second NR processing unit 1061 is different from that in the first embodiment. The other conditions, the method of PD readout, the configuration of the image processing apparatus, the process at the time of frame readout, and the process by the first NR processing unit 105 are the same as those in the first embodiment and thus descriptions thereof will be omitted.

Figure 10:
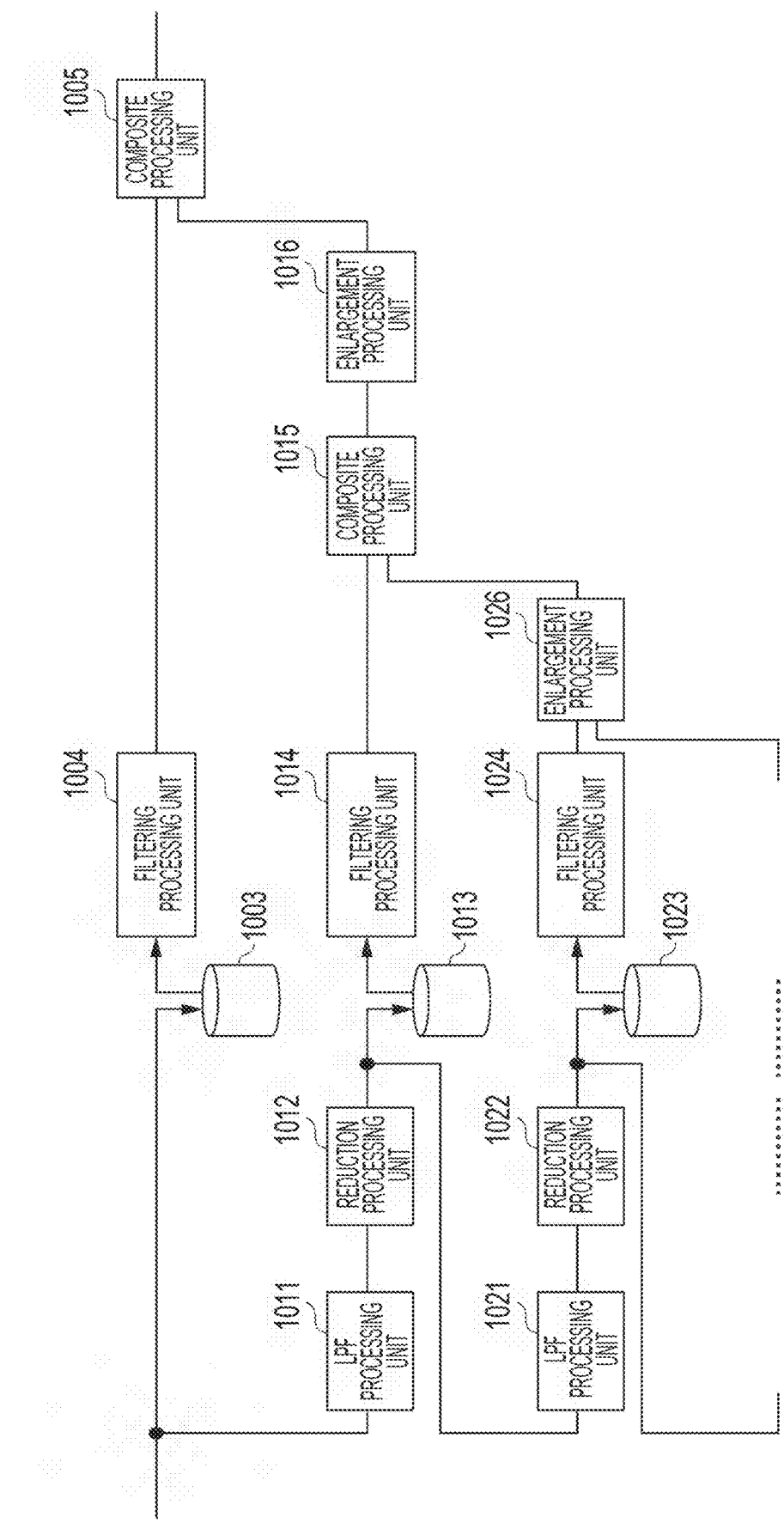
FIG. 10 is a diagram illustrating an example of a configuration of a second NR processing unit according to the embodiment.

FIG. 10 is a schematic block diagram of the second NR processing unit 1061 according to the second embodiment.

The second NR processing unit 1061 first saves an image signal output from the first NR processing unit 105 in a memory 1003.

Further, a low pass filter (LPF) processing unit 1011 performs an LPF process on the image signal output from the first NR processing unit 105, and a reduction processing unit 1012 performs a reduction process of the size of the image signal and saves the reduced image signal in a memory 1013.

Moreover, an LPF processing unit 1021 performs an LPF process on the image signal output from the reduction processing unit 1012, and a reduction processing unit 1022 performs a reduction process on the image signal and saves the reduced image signal in a memory 1023.

The LPF processing unit 1011 and the LPF processing unit 1021 perform a band limitation filtering process to suppress aliasing of the image due to the reduction process. For example, the band limitation filter performs the LPF process in the vertical direction, and then performs the LPF process in the horizontal direction to reduce the amplification of the high frequency.

The reduction processing unit 1012 and the reduction processing unit 1022 perform the reduction process on the image signal that is band-limited and output from the LPF processing unit 1011 and the LPF processing unit 1021. In the reduction process, the reduction processing unit 1012 and the reduction processing unit 1022 generate an image signal horizontally and vertically half the size of the input image signal by dropping one each pixel horizontally and vertically from the input image signal, and output the same, for example. The output signal is temporarily saved in the memory 1013 or 1023.

Filtering processing units 1004, 1014, and 1024 read the image signals from the memories 1003, 1013, and 1023, and perform the filtering process on the read image signals to reduce noise according to their respective frequency bands.

In the filtering process, average value processing is carried out such that the focused pixel is compared in signal value to the surrounding pixels, and only the pixels with the differences from the signal value of the focused pixel equal to or lower than a threshold are used. This filtering process is an example and another filtering process may be performed to suppress noise components by the use of a ε filter, a bilateral filter, or the like.

Next, an enlargement processing unit 1026 outputs an image formed by performing an enlargement process on the image signal output from the filtering processing unit 1024. In the enlargement process, bilinear interpolation or the like is performed on the image signal to enlarge the image to the size before the reduction process by the reduction processing unit 1022.

Next, a composite processing unit 1015 performs a linear composite process on the image signal output from the filtering processing unit 1014 and the image signal output from the enlargement processing unit 1026. The composite processing unit 1015 detects the degree of flatness of the image from the image signal output from the filtering processing unit 1014 and controls adaptively the composite ratio used in the linear composite process. When the degree of flatness of the image is high, the composite processing unit 1015 adjusts the composite ratio such that the ratio of the image signal output from the enlargement processing unit 1026 becomes higher, and when the degree of flatness of the image is low, the composite processing unit 1015 adjusts the composite ratio such that the proportion of the image signal output from the filtering processing unit 1014 becomes higher.

The image signal output from the enlargement processing unit 1026 is more effective in noise reduction than the image signal output from the filtering processing unit 1014. In contrast, as for the edge parts, the image signal output from the enlargement processing unit 1026 is lower in perceived resolution than the image signal output from the filtering processing unit 1014. Accordingly, the composite processing unit 1015 detects the degree of flatness and adjusts the composite ratio for linear composition, thereby making it possible to create an image in which the flat parts are effective in noise reduction and the edge parts are high in perceived resolution.

Next, an enlargement processing unit 1016 outputs an image formed by performing an enlargement process on the image signal output from the composite processing unit 1015. In the enlargement process, bilinear interpolation or the like is performed to enlarge the image to the size before the reduction process by the reduction processing unit 1012.

Next, a composite processing unit 1005 performs linear composition of the image signal output from the filtering processing unit 1004 and the image signal output from the enlargement processing unit 1016. The process by the composite processing unit 1005 is the same as that by the composite processing unit 1015 and descriptions thereof will be omitted.

As described above, the second NR processing unit 1061 performs the filtering process on the size-reduced image and then performs the composite process after enlargement, thereby performing NR processing in such a manner as to enhance the effect of reducing noise in the flat parts and maintain the perceived resolution of the edges.

In the embodiment, the reduction process is performed twice. However, the number of times when the reduction process is performed is not limited to this but may be changed. In addition, the filtering processing units 1004, 1014, and 1024 are not essential but may be omitted. This is because the effect of noise reduction can be obtained to some degree simply by compositing the image signals lowered in frequency than the original image signals.

As explained above, in the embodiment, the first NR processing unit 105 performs the filtering process before the second NR processing unit 1061 performs the LPF process in the vertical direction. Without the filtering process by the first NR processing unit 105, performing the LPF process would spread the influence of noise components included in the signals of the rows having undergone the division readout to the other lines. In the embodiment, the first NR processing unit 105 performs the filtering process only on the lines having undergone the division readout at the stage preceding the second NR processing unit 1061, thereby allowing the second NR processing unit 1061 to perform the LPF process regardless of the pixels having undergone the addition readout or the pixels having undergone the division readout.

In the first and second embodiments, the first NR processing unit 105 performs the process after the process by the sensor correction unit 103. However, the present embodiment is not limited to this but the processing order may be changed according to the contents of the processes.

Third Embodiment

In a third embodiment, the control unit 109 can switch between the mode of switching the readout operation by line and the mode of performing the division readout on all the pixels in the effective region 301*a* of the pixel section 301 explained above in relation to the first and second embodiments. The processing speed can be higher in the case of performing the division readout only in part of the region than in the case of performing the division readout in the entire region. On the contrary, in the case of performing the division readout in the entire region, it is possible to obtain the focus detection signals from the entire region and perform effectively image processing (for example, blurring performance) taking range information into account. Accordingly, it can be conceived that the division readout is performed in part of the region in a moving image capturing mode or a high-speed continuous shooting mode in which a higher processing speed is required, and the division readout is performed in the entire region in other shooting modes (for example, a still image capturing mode).

When the still image capturing mode is selected, the control unit 109 performs a control to subject all the pixels in the effective region 301*a* of the pixel section 301 to the division readout, and stops the filtering process by the first NR processing unit 105. The image signals from the sensor correction unit 103 may be entered into the signal processing unit 106 bypassing the first NR processing unit 105, or the first NR processing unit 105 may have a path through which the image signals input into the first NR processing unit 105 can be output directly.

However, the noise levels of the signals of the pixels obtained by the division readout are higher than the noise levels of the signals of the pixels obtained by the addition readout, and therefore the noise levels of the image signals input into the signal processing unit 106 are higher than those in the first embodiment. Accordingly, it is necessary to control the correction levels by adjusting the filtering as appropriate and adjusting the cutoff frequencies of the LPF processing unit 1011 and the LPF processing unit 1021 as appropriate. By making the foregoing adjustments, it is possible to perform the noise reduction process suited to the signals obtained by the division readout.

Another Embodiment

The present embodiment can also be achieved such that a program implementing one or more of the functions in the foregoing embodiments is supplied to a system or an apparatus via a network or a recording medium, and the program is read and operated by one or more processors in a computer of the system or the apparatus. In addition, the present embodiment can also be achieved by a circuit implementing one or more of the functions (for example, ASIC).

Other Embodiments

Embodiment(s) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imaging apparatus comprising:
an imaging element including a plurality of pixels configured to have a plurality of photoelectric conversion units for one micro lens;
at least one memory configured to store instructions; and
at least one processor in communication with the at least one memory and configured to execute the instructions to perform operations including:
performing a first readout operation on pixels included in a first region of the imaging element to read, as individual signals, signals according to accumulated electric charges, and performing a second readout operation, different from the first readout operation, on pixels included in a second region different from the first region to read signals, as combined signals, according to accumulated electric charges, and
making, to reduce noise levels, a first correction to the signals read from the first region and a second correction to the signals read from the first region corrected by the first correction and to the signals read from the second region,
wherein the first correction is performed using at least one of combined signals obtained from a neighboring pixel in the first region.

2. The imaging apparatus according to claim 1, wherein making the first correction includes not making the first correction to the signals acquired from the second region.

3. The imaging apparatus according to claim 1, wherein, after making the first correction, differences between noise levels included in the signals corrected by the first correction and noise levels included in the signals read by the second readout operation become smaller.

4. The imaging apparatus according to claim 1, wherein, in at least one correction, making includes making a signal level correction to a signal level of a focused pixel as a processing target of the signal level correction based on signal levels of pixels that are neighboring pixels to the focused pixel.

5. The imaging apparatus according to claim 4,
wherein setting includes setting a number of the neighboring pixels to be compared to the signal level of the focused pixel, and
wherein, as noise level included in the signal of the focused pixel is higher, setting includes increasing, in at least one correction, the number of the neighboring pixels to be compared to the signal level of the focused pixel.

6. The imaging apparatus according to claim 4, wherein, in the at least one correction, executing the instructions further performs operations including:
calculating differences between the signal level of the focused pixel and the signal levels of the neighboring pixels, and
making, by using of the signal levels of the neighboring pixels with differences smaller than a predetermined threshold, the signal level correction to the signal level of the focused pixel.

7. The imaging apparatus according to claim 6, wherein, as the noise level included in the signal of the focused pixel is higher, executing the instructions further performs operations including increasing the predetermined threshold.

8. The imaging apparatus according to claim 1, wherein the noise levels included in the signals read by the first readout operation are higher than the noise levels included in the signals read by the second readout operation.

9. The imaging apparatus according to claim 8, wherein making the second correction includes performing a process by a low pass filter on a signal of a focused pixel.

10. The imaging apparatus according to claim 8,
wherein, in a first mode, performing includes performing the first readout operation on pixels included in the first region and performing the second readout operation on pixels included in the second region,
wherein, in a second mode, performing includes performing the second readout operation on pixels included in the first region and the second region, and
wherein, to change a level of the second correction, executing the instructions further performs operations including changing between the second mode and the first mode.

11. The imaging apparatus according to claim 1,
wherein the first readout operation is an operation of reading signals plural times according to electric charges accumulated in first plural photoelectric conversion units that are included in the pixels included in the first region, and
wherein the first readout operation includes a first operation to read signals according to electric charges accumulated in predetermined photoelectric conversion units of the first plural photoelectric conversion units, and includes a second operation to read signals according to electric charges accumulated in photoelectric conversion units different from the predetermined photoelectric conversion units without reading the signals according to the electric charges accumulated in the predetermined photoelectric conversion units.

12. The imaging apparatus according to claim 11, wherein the second readout operation is an operation of reading signals plural times according to electric charges accumulated in second plural photoelectric conversion units that are included in the pixels included in the second region.

13. The imaging apparatus according to claim 12, wherein setting includes setting a position of the first region where the first readout operation is performed and a position of the second region where the second readout operation is performed.

14. The imaging apparatus according to claim 13, wherein setting includes (i) setting a position of a position detection region, (ii) changing, according to the position of the position detection region, the position of the first region where the first readout operation is performed, and (iii) changing, according to the position of the position detection region, the position of the second region where the second readout operation is performed.

15. The imaging apparatus according to claim 1,
wherein, in a first mode, performing includes performing the first readout operation on pixels included in the first region and performing the second readout operation on pixels included in the second region,
wherein, in a second mode, performing includes performing the second readout operation on pixels included in the first region and the second region, and
wherein, in the second mode, making includes making the second correction to the signals read from the first region and the second region.

16. The imaging apparatus according to claim 1, wherein the individual signals refer to signals obtained by individual photo diodes, and the combined signals refer to signals obtained by adding signals obtained by a plurality of individual photo diodes.

17. A method for an imaging apparatus having an imaging element including a plurality of pixels configured to have a plurality of photoelectric conversion units for one micro lens, the method comprising:
performing a first readout operation on pixels included in a first region of the imaging element to read, as individual signals, signals according to accumulated electric charges, and performing a second readout operation, different from the first readout operation, on pixels included in a second region different from the first region to read signals, as combined signals, according to accumulated electric charges; and
making, to reduce noise levels, a first correction to the signals read from the first region and a second correction to the signals read from the first region corrected by the first correction and to the signals read from the second region,
wherein the first correction is performed using at least one of combined signals obtained from a neighboring pixel in the first region.

18. A non-transitory computer-readable storage medium storing a program to cause a computer to perform a method for an imaging apparatus having an imaging element including a plurality of pixels configured to have a plurality of photoelectric conversion units for one micro lens, the method comprising:
performing a first readout operation on pixels included in a first region of the imaging element to read, as individual signals, signals according to accumulated electric charges, and performing a second readout operation, different from the first readout operation, on pixels included in a second region different from the first region to read signals, as combined signals, according to accumulated electric charges; and making, to reduce noise levels, a first correction to the signals read from the first region and a second correction to the signals read from the first region corrected by the first correction and to the signals read from the second region, wherein the first correction is performed using at least one of combined signals obtained from a neighboring pixel in the first region.

* * * * *